United States Patent
Kim et al.

(10) Patent No.: US 7,679,819 B2
(45) Date of Patent: Mar. 16, 2010

(54) FEED-FORWARD CURRENT INJECTION CIRCUITS AND SEMICONDUCTOR OPTICAL AMPLIFIER STRUCTURES FOR DOWNSTREAM OPTICAL SIGNAL REUSE METHOD

(75) Inventors: Byoung Whi Kim, Daejeon (KR); Mahn Yong Park, Gwangju (KR); Seung Hyun Cho, Daejeon (KR); Woo Ram Lee, Daejeon (KR); Jie Hyun Lee, Daejeon (KR); Geon Jeong, Daejeon (KR); Chul Young Kim, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 482 days.

(21) Appl. No.: 11/651,262

(22) Filed: Jan. 9, 2007

(65) Prior Publication Data

US 2007/0183788 A1 Aug. 9, 2007

(30) Foreign Application Priority Data

Jan. 9, 2006 (KR) ............ 10-2006-0002386
Oct. 20, 2006 (KR) ............ 10-2006-0102456
Jan. 4, 2007 (KR) ............ 10-2007-0001140

(51) Int. Cl.
*H01S 3/00* (2006.01)

(52) U.S. Cl. .................................... 359/344
(58) Field of Classification Search .............. 359/344, 359/237, 248
See application file for complete search history.

(56) References Cited

U.S. PATENT DOCUMENTS

| 5,559,624 | A | 9/1996 | Darcie et al. |
| 5,815,295 | A | 9/1998 | Darcie et al. |
| 6,249,373 | B1 * | 6/2001 | Woodward ............... 359/344 |
| 7,274,010 | B2 * | 9/2007 | Matsuda et al. ...... 250/214 LA |
| 7,280,272 | B2 * | 10/2007 | Akiyama ............... 359/344 |
| 7,339,726 | B2 * | 3/2008 | Fathimulla et al. ........ 359/344 |
| 7,474,460 | B2 * | 1/2009 | Fujiwara et al. ........... 359/344 |
| 2004/0120028 | A1 * | 6/2004 | Heim et al. ............... 359/344 |
| 2006/0024066 | A1 * | 2/2006 | Fujiwara et al. ........... 398/183 |
| 2006/0215255 | A1 * | 9/2006 | Akiyama ............... 359/344 |

OTHER PUBLICATIONS

Boivin, L., et al., "Bi-directional transmission using loopback and a spectrally-filtered modelocked laser." Dec. 10, 1998. *Electronics Letters*, vol. 34, No. 25, pp. 2404-2405.

* cited by examiner

*Primary Examiner*—Mark Hellner
(74) *Attorney, Agent, or Firm*—Ladas & Parry LLP (57) ABSTRACT

A reflective semiconductor optical amplifier (RSOA) and an operating system based on a downstream optical signal reuse method with feed-forward current injection are provided. The RSOA has two active regions and includes a reflecting plane that reflects an input optical signal; and an optical amplifying semiconductor including a rear portion, which is positioned at a side of the reflecting plane and to which a signal having polarity opposite to that of the input optical signal is injected, and a front portion, which is positioned at a side opposite to the side of the rear portion facing the reflecting plane and which the input optical signal is passed though and a signal used to modulate a reflected input optical signal from the reflecting plane to an output optical signal is injected into.

11 Claims, 11 Drawing Sheets

FEED-FORWARD CURRENT INJECTION CIRCUITS AND SEMICONDUCTOR OPTICAL AMPLIFIER STRUCTURES FOR DOWNSTREAM OPTICAL SIGNAL REUSE METHOD

CROSS-REFERENCE TO RELATED PATENT APPLICATIONS

This application claims the benefits of Korean Patent Application No. 10-2006-0002386, filed on Jan. 9, 2006, Korean Patent Application No. 10-2006-0102456, filed on Oct. 20, 2006, and Korean Patent Application No. 10-2007-0001140, filed on Jan. 4, 2007 in the Korean Intellectual Property Office, the disclosures of which are incorporated herein in their entirety by reference.

BACKGROUND OF THE INVENTION

1. Field of the Invention

The present invention relates to reuse of a modulated input optical signal by flattening the modulated input optical signal in a reflective semiconductor optical amplifier (RSOA) or in a semiconductor optical amplifier (SOA) to convert into an upstream optical signal, and more particularly, to an operating system in which a signal having polarity opposite to that of the input optical signal is injected into the RSOA to improve the flatness of the input optical signal to reuse the input optical signal and an SOA structure that is suitable for the wavelength reuse method.

2. Description of the Related Art

In order to realize a wavelength-division-multiplexed passive optical network (WDM-PON) using a conventional RSOA, there has been suggested a method in which an optical signal that is modulated into downstream data by a central office (CO) is transmitted to the RSOA of an optical network terminal (ONT) and the RSOA is operated at a gain saturation region with respect to the power of the input optical signal to greatly reduce a difference between level '0' and level '1' of the input optical signal when the input optical signal is remodulated by upstream data. In such an optical signal reusing method, when the gain saturation of the RSOA occurs at lower optical power, an optical power budget in an optical link increases, and therefore, gain saturation power needs to be reduced to be as little as possible and an optical signal input to the RSOA needs to be amplified sufficiently for upstream transmission. Consequently, a gain of the RSOA needs to be large enough.

However, in actuality, the compressing ability of the RSOA in the gain saturation region is limited, and therefore, there is a limit in reducing an extinction ratio (ER) of the input optical sufficiently. In this case, when the residual ER is directly modulated by the upstream data again, the residual ER is reflected to the thickness of the level '1'. As the level '1' is thicker, upstream transmission quality is getting worse. If the level '1' is thicker than a certain thickness, the upstream transmission quality is getting worse rapidly. Accordingly, the ER of a downstream optical signal may need to be decreased to a minimum, which is just enough for transmission. At this time, due to the low ER of the downstream optical signal, power penalty may occur in downstream transmission. Especially, if the optical wavelengths of apparatuses that comprise a downstream link are even slightly misarranged, the ER of an optical signal input into a receiver is getting smaller than the ER of an optical signal output from a transmitter, so that sensitivity that the transmitting quality is getting worse rapidly is shown.

SUMMARY OF THE INVENTION

The present invention provides reflective semiconductor optical amplifier (RSOA) and an operating system for improving the reuse of an optical signal by reducing an extinction ratio (ER) of a downstream optical signal, which is input to the RSOA, more than reduction, which is done by gain saturation by injecting current with polarity opposite to that of the input optical signal into the RSOA and adjusting the amount of optical power gain of the RSOA.

According to an aspect of the present invention, there is provided a system for operating a reflecting semiconductor optical amplifier, the system comprising: a splitter that diverges an input optical signal to a first signal and a second signal; a reflecting semiconductor optical amplifier having a single active region, which reflects the second signal with a reflecting plane and receives a combination between a signal with polarity opposite to the second signal and a signal used to modulate the second signal reflected from the reflecting plane to an output optical signal; a data photo diode that converts the first signal into a current signal; a transmitting amplifier that amplifies and converts the current signal transmitted from the data photo diode into a voltage signal; a RF amplifier that amplifies a voltage signal obtained by inverting a polarity of the voltage signal transmitted from the transmitting amplifier to a flattening signal having a level suitable for flattening an amplitude of the second signal; a RF delay that delays the flattening signal transmitted from the RF amplifier according to timing of the second signal; and a signal combiner that combines the flattening signal transmitted from the RF delay and the signal used to modulate the second signal to the output optical signal and injecting a combined signal to the single active region of the reflective semiconductor optical amplifier.

According to another aspect of the present invention, there is provided an RSOA that has two active regions. The RSOA includes a reflecting plane that reflects an input optical signal; and an optical amplifying semiconductor comprising a rear portion, which is positioned at a side of the reflecting plane and to which a signal having polarity opposite to that of the input optical signal is injected, and a front portion, which is positioned at a side opposite to the side of the rear portion facing the reflecting plane and which the input optical signal is passed though and a signal used to modulate a reflected input optical signal from the reflecting plane to an output optical signal is injected into.

According to still another aspect of the present invention, there is provided a SOA including a first active region receiving a signal having polarity opposite to that of an input optical signal and flattening an amplitude of the input optical signal; a second active region positioned at a side of the first active region to receive DC current and amplify the input optical signal, which has passed through the first active region; and a third active region positioned at a side of the second active region, which is opposite to the side facing the first active region to receive a signal, which is used to modulate the input optical signal that has passed through the second active region to an output optical signal.

The RSOA may be an optical amplifier having two active regions and may include the reflecting plane that reflects an input optical signal; and an optical amplifying semiconductor comprising a rear portion, which is positioned at a side of the reflecting plane and to which a signal having polarity opposite to that of the input optical signal is injected, and a front portion, which is positioned at a side opposite to the side of the rear portion facing the reflecting plane and which the input optical signal is passed though and the signal used to modulate a reflected input optical signal from the reflecting plane to the output optical signal is injected into. The flattening signal transmitted from the RF delay may be injected into the rear portion of the reflecting semiconductor optical amplifier, which has two active regions. The signal used to modulate the second signal to the output optical signal may be injected into the front portion of the reflecting semiconductor optical amplifier, which has two active regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, preferred embodiments of present invention will be described in detail with reference to the attached drawings.

Figure 1:
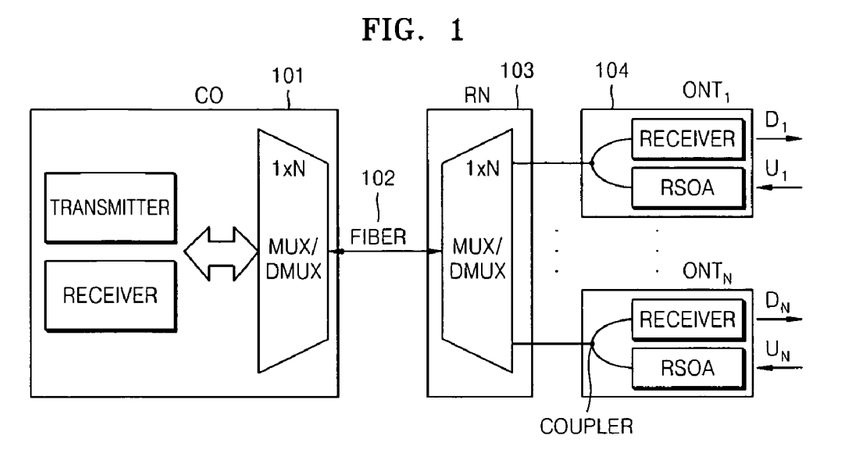
FIG. 1 is a conceptual diagram of a wavelength-division-multiplexed passive optical network (WDM-PON) based on a reflective semiconductor optical amplifier (RSOA) that reuses an optical signal.

FIG. 1 is a conceptual diagram of a wavelength-division-multiplexed passive optical network (WDM-PON) based on a reflective semiconductor optical amplifier (RSOA) that reuses an optical signal. Referring to FIG. 1, the WDM-PON includes a central office (CO) 101, an optical fiber 102, a remote node (RN) 103, and an optical network terminal (ONT) 104.

The CO 101 includes an optical source unit, that transmits downstream data, a receiver that receives upstream data, and an optical multiplexer/demultiplexer (MUX/DMUX) that multiplexes and demultiplexes an optical wavelength.

The RN 103 includes an optical MUX/DMUX comprised by a single arrayed waveguide grating (AWG) or a thin film filter (TFF). A multiplexed downstream optical signal, which is input to the optical MUX/DMUX in the RN 103, is divided into wavelengths, which are transmitted to ONTs 104 through optical fiber.

Each ONT 104 includes an RSOA, an optical receiver, and a coupler, which can be comprised as discrete components or can be intergrated into a single substrate. The coupler distributes downstream optical power, which is received through the optical fiber, to the RSOA and to the optical receiver considering an optical power budget and a gain saturation of input power. The optical receiver receives a downstream optical signal $D_i$ (where i=1~N), and the RSOA remodulates the input downstream optical signal to an upstream optical signal $U_i$ (where i=1~N) and transmits the upstream optical signal $U_i$ to the CO 101.

The upstream optical signal $U_i$ output from the RSOA is multiplexed by the optical MUX/DMUX of the RN 103 and then transmitted to the CO 101 through the optical fiber 102. The optical signal input to the CO 101 is demultiplexed by the MUX/DMUX in the CO 101 and then input to the receiver by channels (or wavelengths). The receiver finally receives an upstream optical signal $U_N$.

Figure 2:
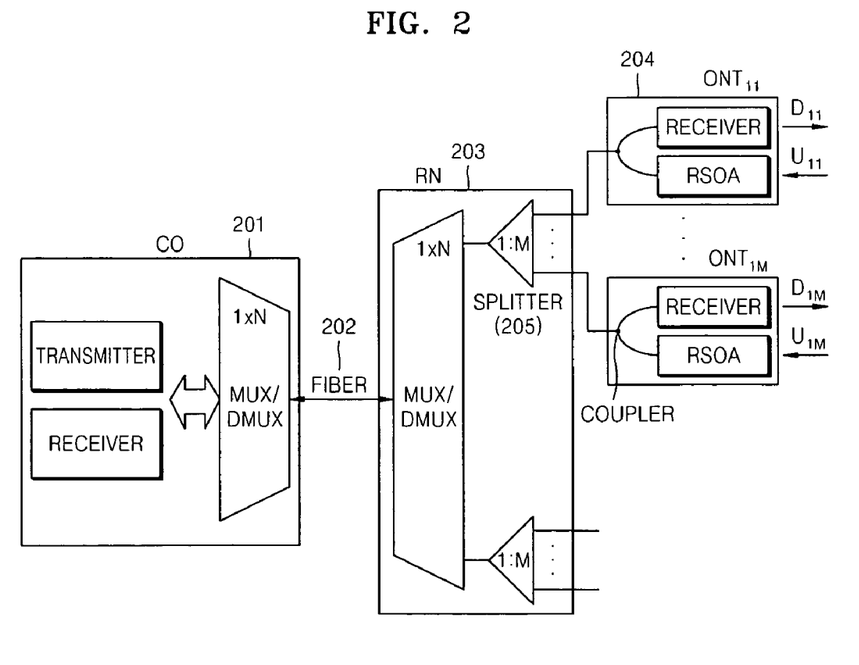
FIG. 2 is a conceptual diagram of a WDM-PON-time division multiplexing (TDM) based on an RSOA that reuses an optical signal.

FIG. 2 is a conceptual diagram of a WDM-PON-time division multiplexing (TDM) based on an RSOA that reuses an optical signal. Referring to FIG. 2, a WDM-PON-TDM system includes a central office (CO) 201, an optical fiber 202, a remote node (RN) 203, an optical network terminal (ONT) 204, and a splitter 205, which is included in the RN 203. The elements 201 through 204 have the same roles and functions as the elements 101 through 104 illustrated in FIG. 1.

A split ratio of 1:M of the splitter 205 is determined considering a power budget of an overall optical link and a gain saturation of an RSOA for input power. A downstream optical signal is divided by wavelengths by an optical MUX/DMUX and the downstream optical signal of each wavelength is transmitted to M subscribers through the splitter 205. That is, if a wavelength multiplexing ratio is 1:N, the total number of subscribers that can be accommodated is hugely increased to N×M. The downstream optical signal, which is transmitted through the splitter 205 and optical fiber, is input to an RSOA and an optical receiver through a coupler. The downstream optical signal input to the RSOA is remodulated to an upstream optical signal, and the optical receiver restores the downstream optical signal. The downstream optical signal input to the optical receiver includes information sent to a number of subscribers, which has been multiplexed using a time division method and the optical receiver extracts only its relevant information. The RSOA loads the upstream optical signal onto a time slot, which is assigned to the RSOA, when transmitting it to the CO 201, so that the upstream optical signal does not collide with upstream optical signals sent from other (M-1) subscribers. Such upstream optical signals, which are output from RSOAs and transmitted through a maximum of M subscriber channels using TDM, are combined in the splitter 205 of the RN 203, then wavelength-multiplexed by the optical MUX/DMUX, and then is input to an optical receiver of the CO 201 by wavelengths. Here, the optical receiver of the CO 201 is a burst mode optical receiver and needs to have an enough dynamic range to compensate for an optical power difference between the upstream optical signals of the M subscribers that are connects to the splitter 205.

Figure 3:
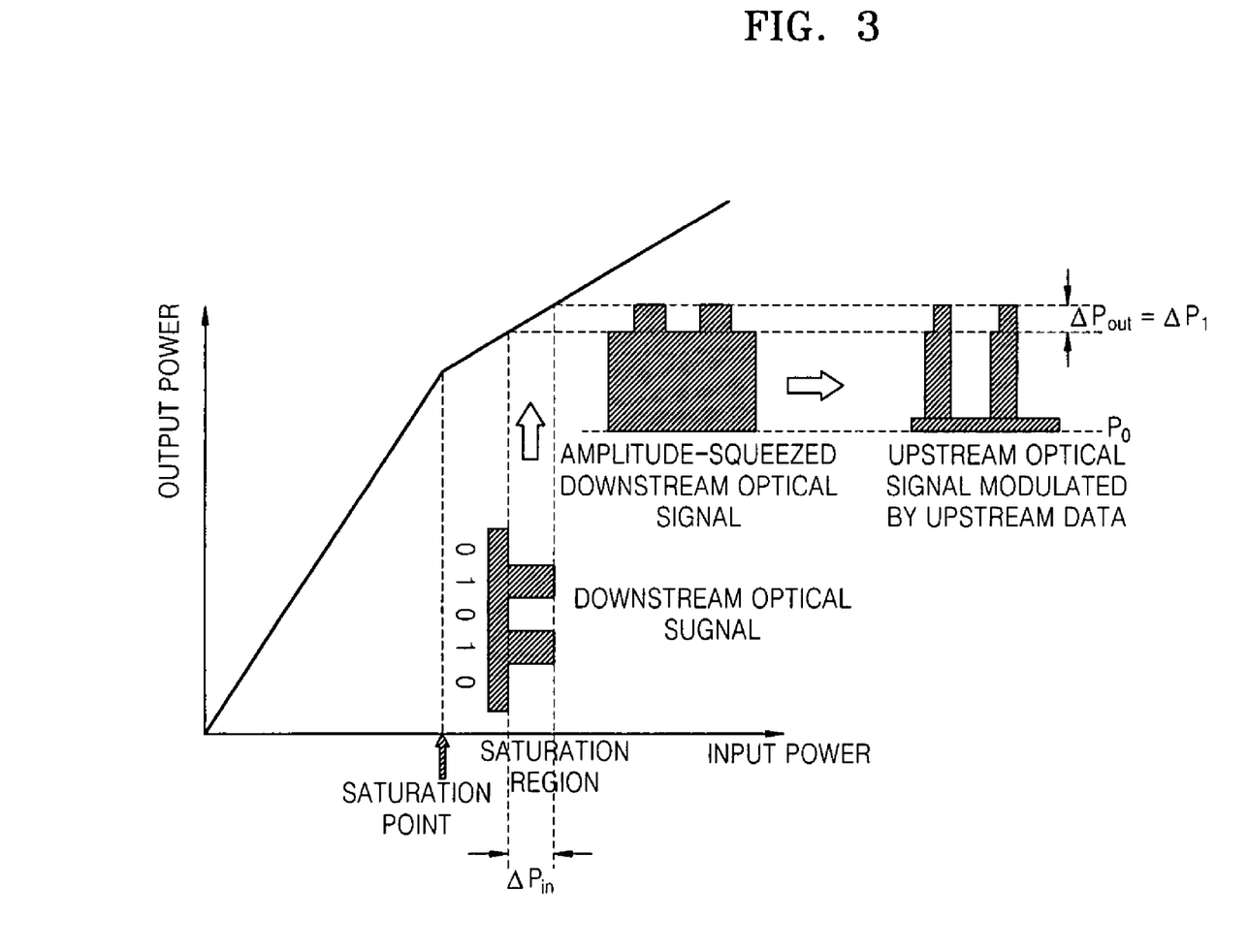
FIG. 3 illustrates flattening by an optical signal compression effect based on a gain saturation of an RSOA.

FIG. 3 illustrates flattening by an optical signal compression effect based on a gain saturation of an RSOA. When a downstream optical signal is input to a region where a gain is saturated (that is, when an input optical power is larger than an optical power at which a gain is saturated), the gain is not sufficiently effected at level '1' since the gain has been saturated at the level '1' while relatively a larger gain is effected at a level '0'. As a result, a difference $\Delta P_{in}$ between the level '1' and the level '0' of the input optical signal is reduced to $\Delta P_{out}$, that is, $\Delta P_{in} > \Delta P_{out}$, which is called amplitude squeezing effect. However, an optical signal, which is not squeezed perfectly, has a residual amplitude of $\Delta P_{out}$, and if it is modulated directly by upstream data at this state, the level '1' of the modulated optical signal becomes thicker, that is, $\Delta P_{in} \rightarrow \Delta P_1$. The quality of upstream transmission gets worse, as the level '1' is thicker. Especially, if the thickness of the level '1' is more than a certain value, the quality of upstream transmission gets worse rapidly and accordingly power penalty increases rapidly. Hence, the ER of the downstream optical signal needs to be decreased greatly. When the ER of the downstream optical signal is small, if the optical wavelengths of apparatuses that are comprised in a downstream link are even slightly misaligned, the ER decreases rapidly and transmission quality gets worse rapidly.

Figure 4:
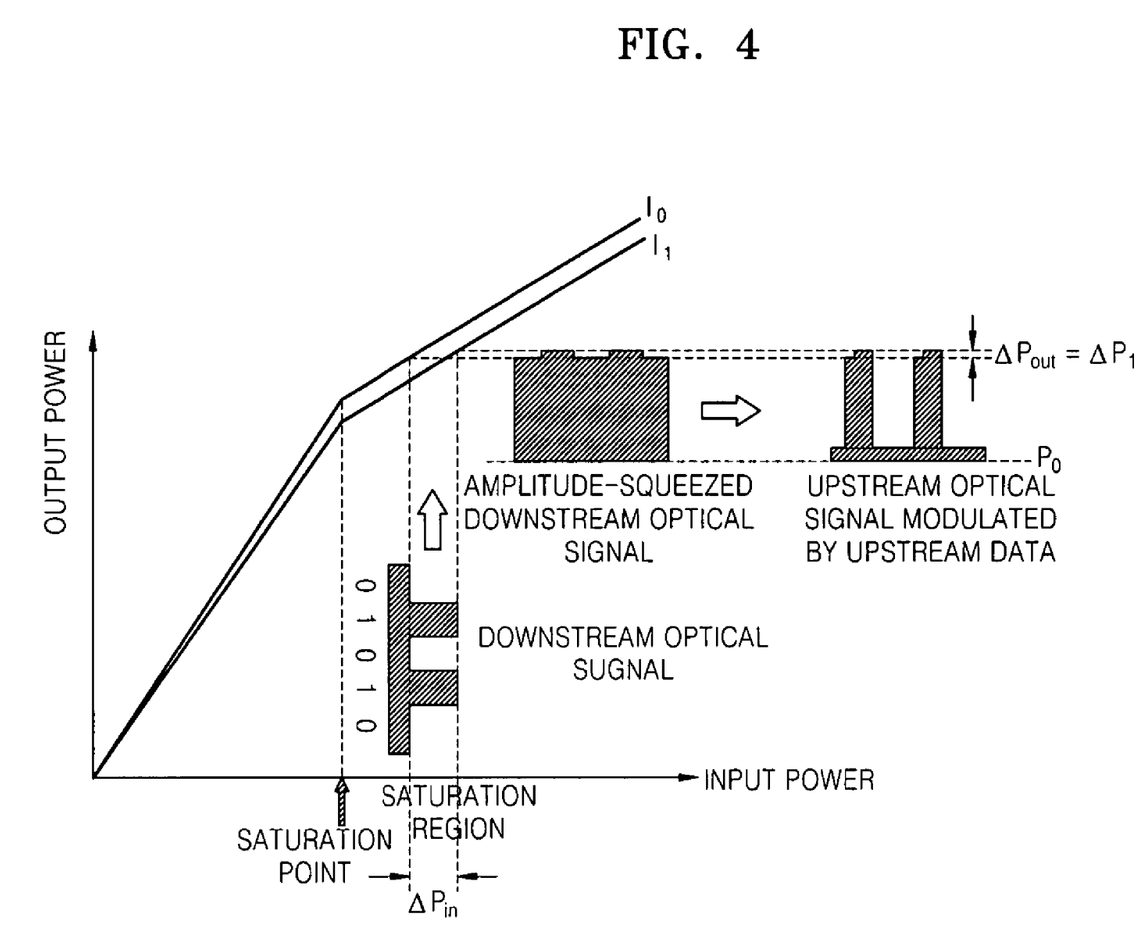
FIG. 4 illustrates that an optical signal is flattened by dynamically controlling injection of feed-forward current.

FIG. 4 illustrates that an optical signal is flattened by dynamically controlling injection of feed-forward current. During a level '1' period of an input optical signal, if the amount of current injection is reduced as compared to that in a level '0' period of the input optical signal, that is, if $I_1 < I_0$, gain is reduced during the level '1' period. Accordingly, a power difference between the level '1' and the level '0' of the input optical can be reduced more than when it is reduced only by gain saturation of an RSOA. Therefore, the ER of the downstream optical signal can be adjusted relatively high, so that the power penalty of the downstream transmission can be reduced. Moreover, a phenomenon, in which the ER is rapidly decreased and the transmission quality gets worse rapidly even if the optical wavelengths of apparatuses that are comprised in a downstream link are slightly misarranged, can be alleviated. At the same time, the upstream transmission quality can be improved by reducing the thickness of the level '1' of the upstream optical signal.

Figure 5:
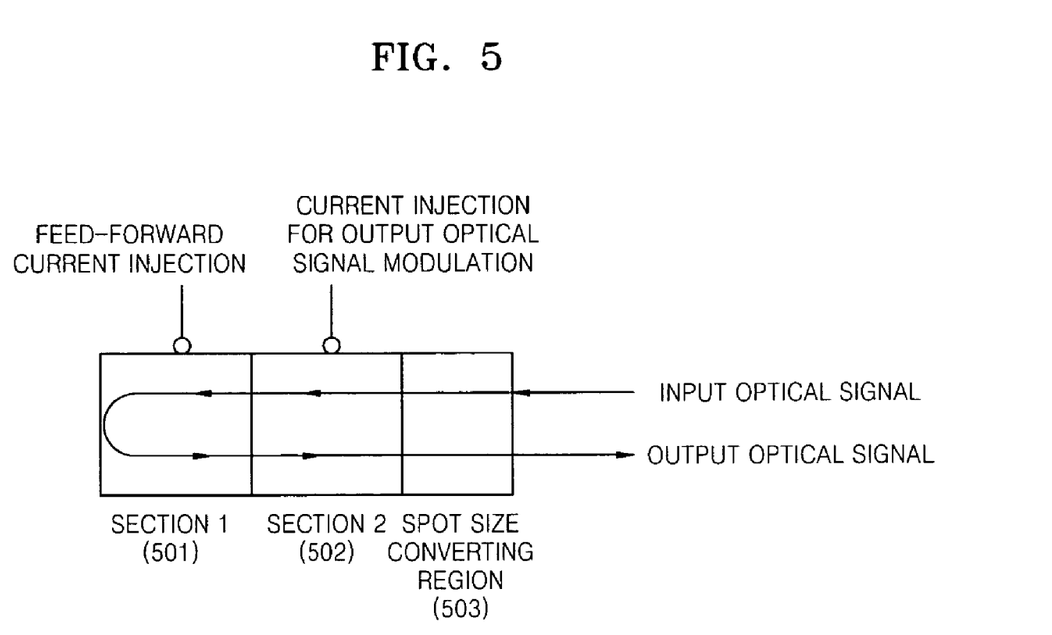
FIG. 5 illustrates the structure or an RSOA, in which an active region is divided into two sections for flattening of an optical amplitude by dynamically controlling injection of feed-forward current, according to an embodiment of the present invention.

FIG. 5 illustrates the structure or an RSOA, in which an active region is divided into two sections for flattening of an optical amplitude by dynamically controlling injection of feed-forward current, according to an embodiment of the present invention. Referring to FIG. 5, the RSOA includes a front portion 502, i.e., a section2, a rear portion 501, i.e., a section1, and a spot size converting (SCC) region 503, which can be included when necessary.

Current for modulating an upstream optical signal is injected into the front portion 502. The modulation property of input optical signal is received and current having polarity opposite to that of the input optical signal is injected into the rear portion 501. The carrier density and the optical power gain of the rear portion 501 are changed according to the injected current so that the gain is reduced at the level '1' of the input optical signal and is increased at the level '0'. Accordingly, the ER of the input optical signal can be eventually reduced greatly.

Figure 6:
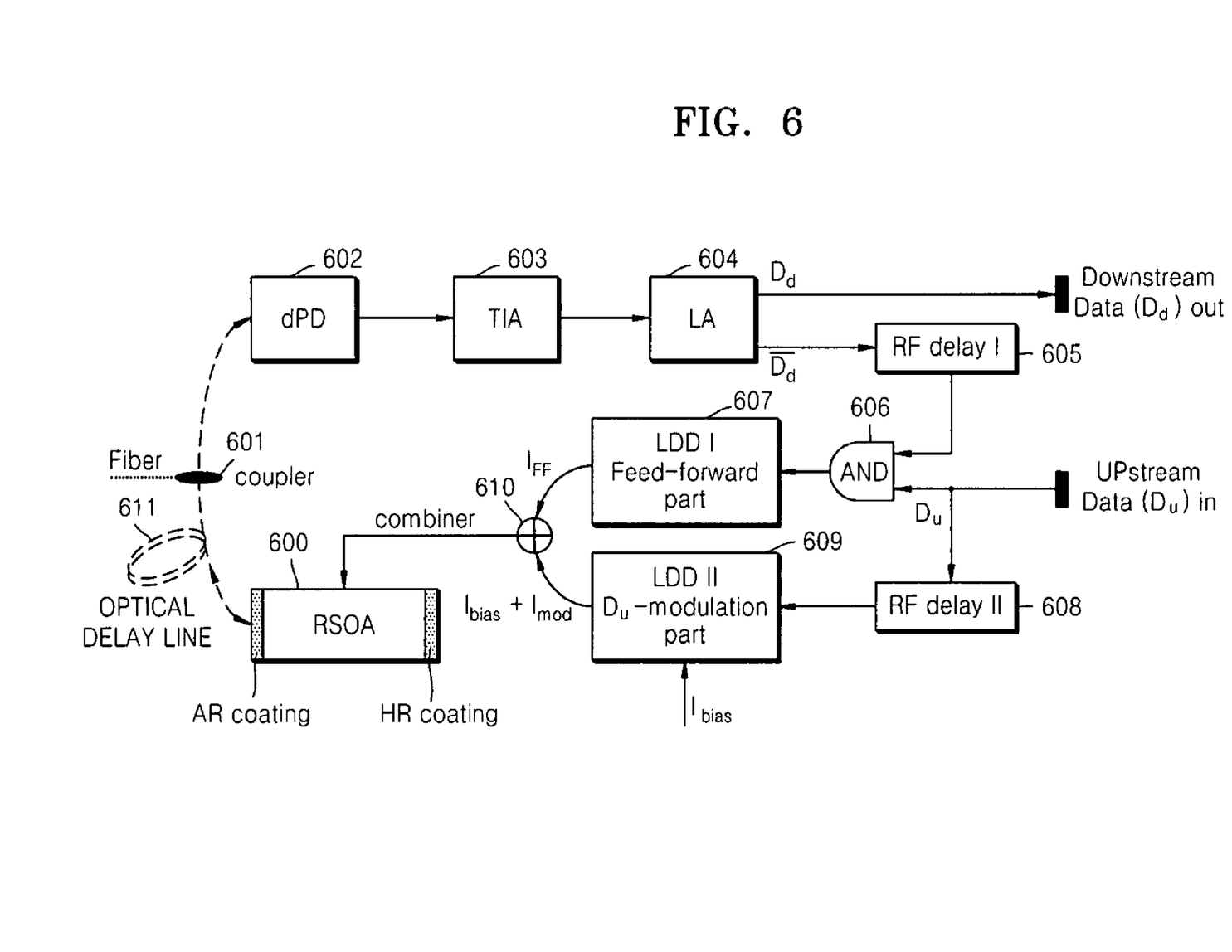
FIG. 6 illustrates an operating circuit for injecting feed-forward current into an RSOA, which includes a single active region, according to an embodiment of the present invention.

FIG. 6 illustrates an operating circuit for injecting a feed-forward current into an RSOA, which includes a single active region, according to an embodiment of the present invention.

Referring to FIG. 6, the operating circuit comprises a coupler 601, a data photodiode (dPD) 602, a transimpedance amplifier (TIA) 603, a limiting amplifier (LA) 604, an RF delay 605 and 608, an AND gate 606, a LD driver (LDD) 607 and 609, a signal combiner 610, an RSOA 600, and an optical delay line 611.

A downstream signal transmitted from a telephone office is power splitted at the coupler 601; a portion of the downstream signal is input to the RSOA 600, and another portion is input to the dPD 602. Optical signal input to the dPD 602 is converted into a current signal and output, and then is amplified in the TIA 603 to be converted into a voltage signal, and then is input to the LA 604 and is re-amplified. Some of output terminals of the LA 604 are output to a downstream data signal processing unit, and some another are input to the RF delay 605. The output of the RF delay 605 is input to the AND gate 606.

Meanwhile, a portion of an input upstream data signal is input to the AND date 606. The AND gate 606 allows the RF delay output signal to pass only when the input upstream data signal is at level '1' and blocks the output of the RF delay output signal when the input upstream data signal is at level '0'. The output signal from the AND gate 606 is converted into a current signal in the LDD 607 and is output.

Another portion of the input upstream data signal is converted into a current signal in the LDD 609 and is mixed with a bias current to be output. The output of the LDD 607 for linear feedback current supply and the output of the LDD 609 for upstream data current supply are respectively mixed in the signal combiner 610 to be injected into the RSOA 600.

In order to optimally flatten the RSOA input optical signal, the phase of a linear feedback signal and the phase of the downstream optical signal input to the RSOA are optimally adjusted by the RF delay I 605. The phase of the upstream signal input to the AND gate 606 and the phase of the upstream signal input to the LDD II (609) are optimally adjusted by the RF delay II 608. Meanwhile, the optical delay line 611 supplements electric delay by the RF delay I 605.

Figure 7:
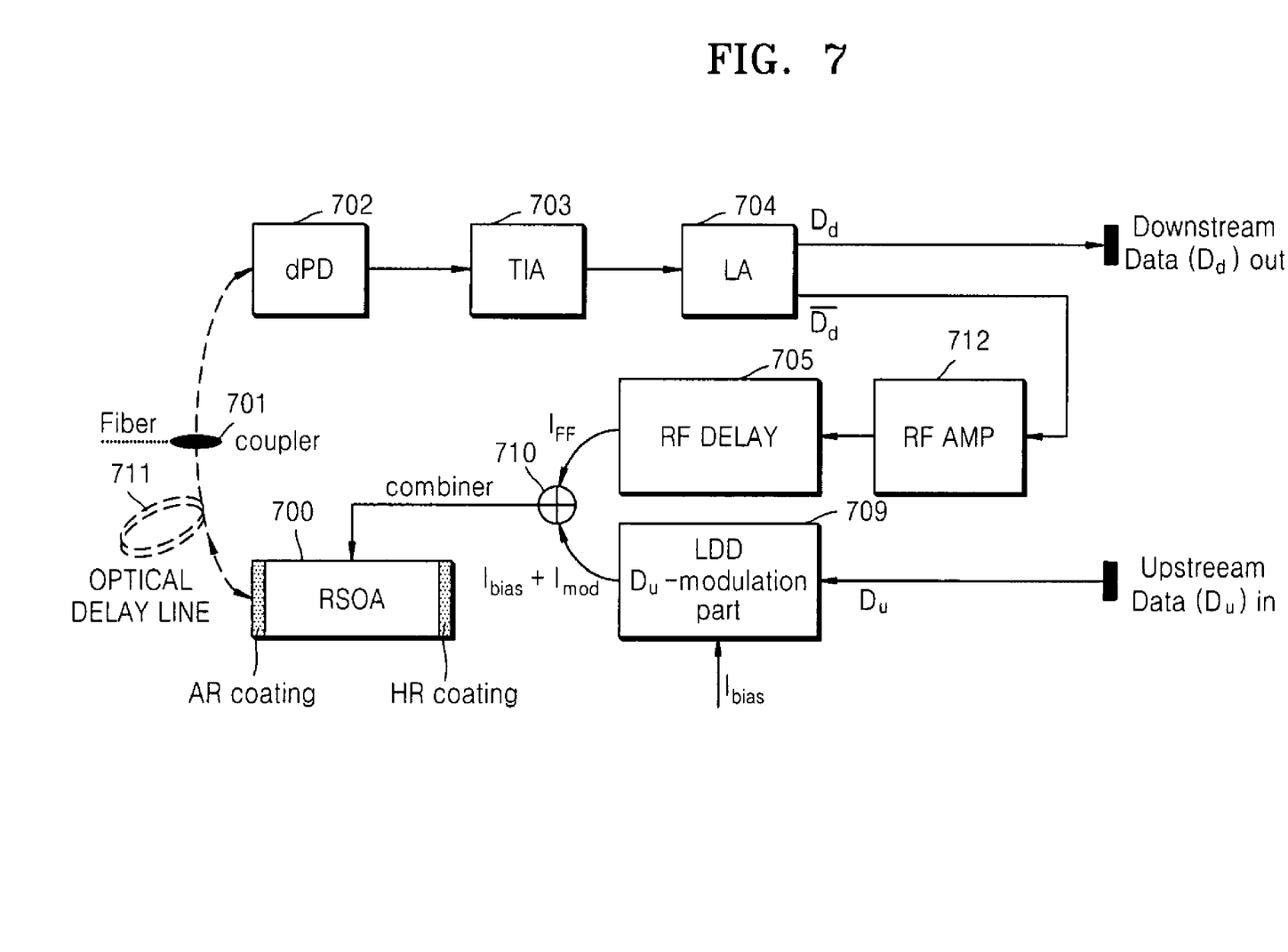
FIG. 7 illustrates an operating circuit for injecting feed-forward current into an RSOA, which includes a single active region, according to another embodiment of the present invention.

FIG. 7 illustrates an operating circuit for injecting a feed-forward current into an RSOA, which includes a single active region, according to another embodiment of the present invention. Referring to FIG. 7, the operating circuit has a similar structure to that of FIG. 6, except that an RF amplifier 712 is added to a front end of the RF delay 705 for adjusting a signal output from an LA 704 for optimal flattening and that an AND gate is not present.

The output of the RF delay 705 is mixed to the output of an LDD 709 for modulating an upstream data in a signal combiner 710 to be input to an RSOA 700. Accordingly, a current input to the RSOA 700 is in a superpositioned form by a dynamic current that has an intensity that is inversely proportional to that of the modulated downstream optical signal and the output of the LDD 709.

Figure 8:
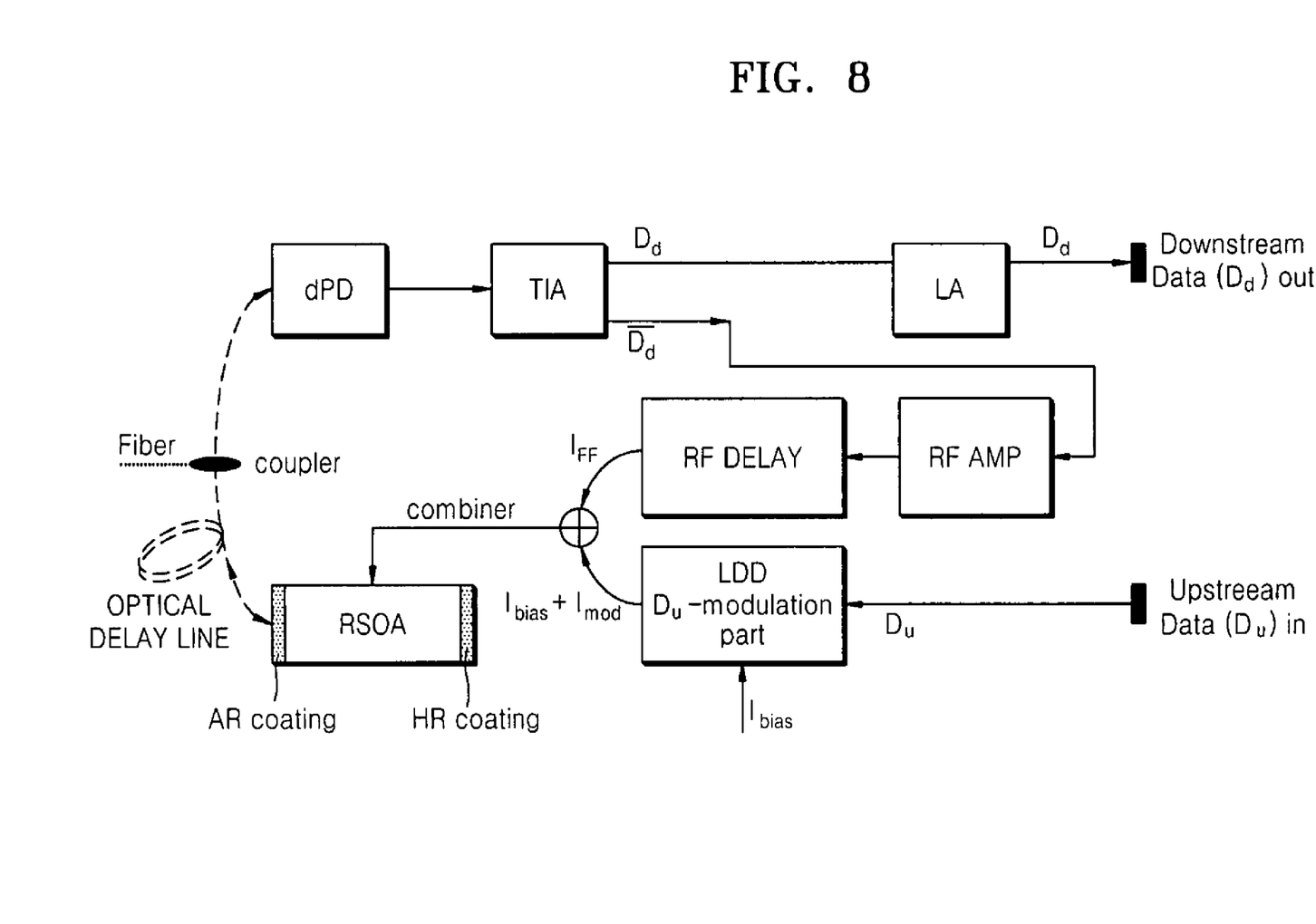
FIG. 8 illustrates an operating circuit for injecting feed-forward current into an RSOA, which includes single active region, according to an embodiment of the present invention.

FIG. 8 illustrates an operating circuit for injecting a feed-forward current into an RSOA, which includes single active regions, according to an embodiment of the present invention. Referring to FIG. 8, the operating circuit has a similar structure to that of FIG. 7, except that some of output terminals of a TIA 703 disposed at a front end of an LA 704 are used for feed forward current injection operation.

Figure 9:
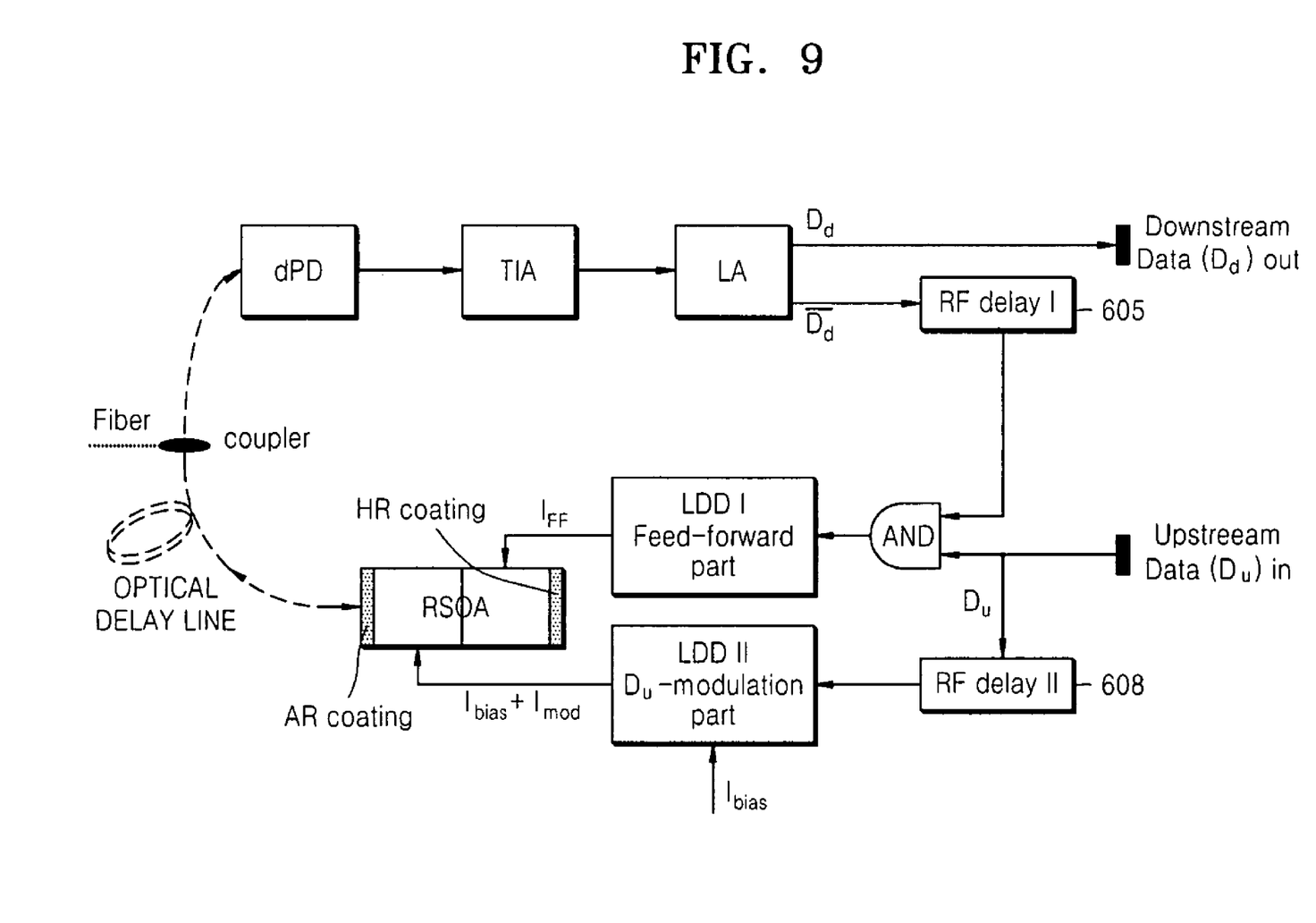
FIG. 9 illustrates an operating circuit for injecting feed-forward current into an RSOA, which includes two active regions, according to an embodiment of the present invention.

FIG. 9 illustrates an operating circuit for injecting a feed-forward current into an RSOA, which includes two active regions, according to an embodiment of the present invention. Referring to FIG. 9, the operating circuit has a similar structure to that of FIG. 6, except that while the RSOA 600 in FIG. 6 has a single active region, the RSOA of FIG. 8 has two active regions formed of a rear portion, which is positioned at a side of the reflecting plane and to which a signal having polarity opposite to that of the input optical signal is injected, and a front portion, which is positioned at a side opposite to the side of the rear portion facing the reflecting plane, passing the input optical signal to the rear portion and modulating the input optical signal reflected from the reflection plane to an output optical signal.

Figure 10:
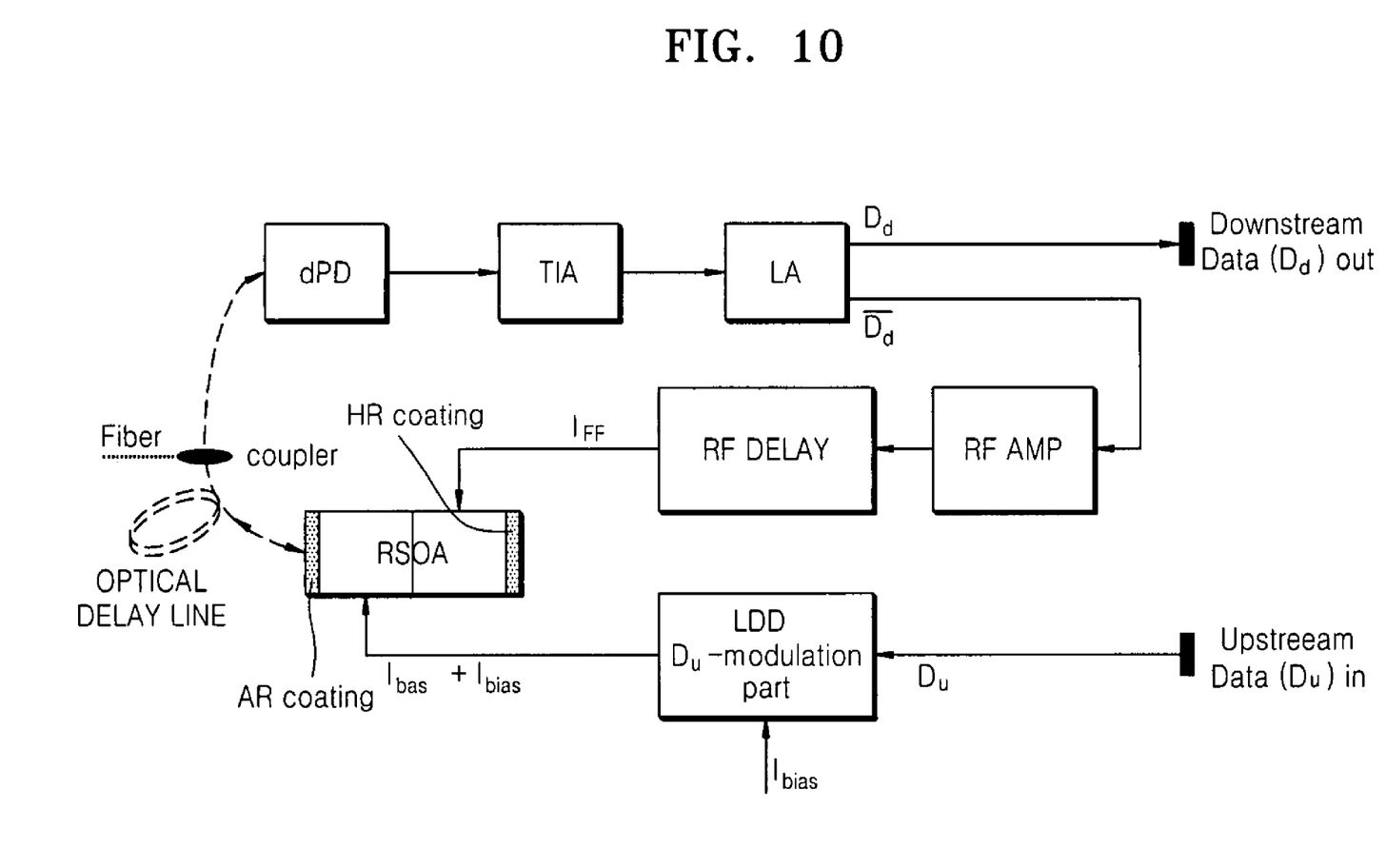
FIG. 10 illustrates an operating circuit for injecting feed-forward current into an RSOA, which includes two active regions, according to another embodiment of the present invention.

FIG. 10 illustrates an operating circuit for injecting feed-forward current into an RSOA, which includes two active regions, according to another embodiment of the present invention. The operating circuit illustrated in FIG. 10 has the same structure as that of the operating circuit illustrated in FIG. 7.

Figure 11:
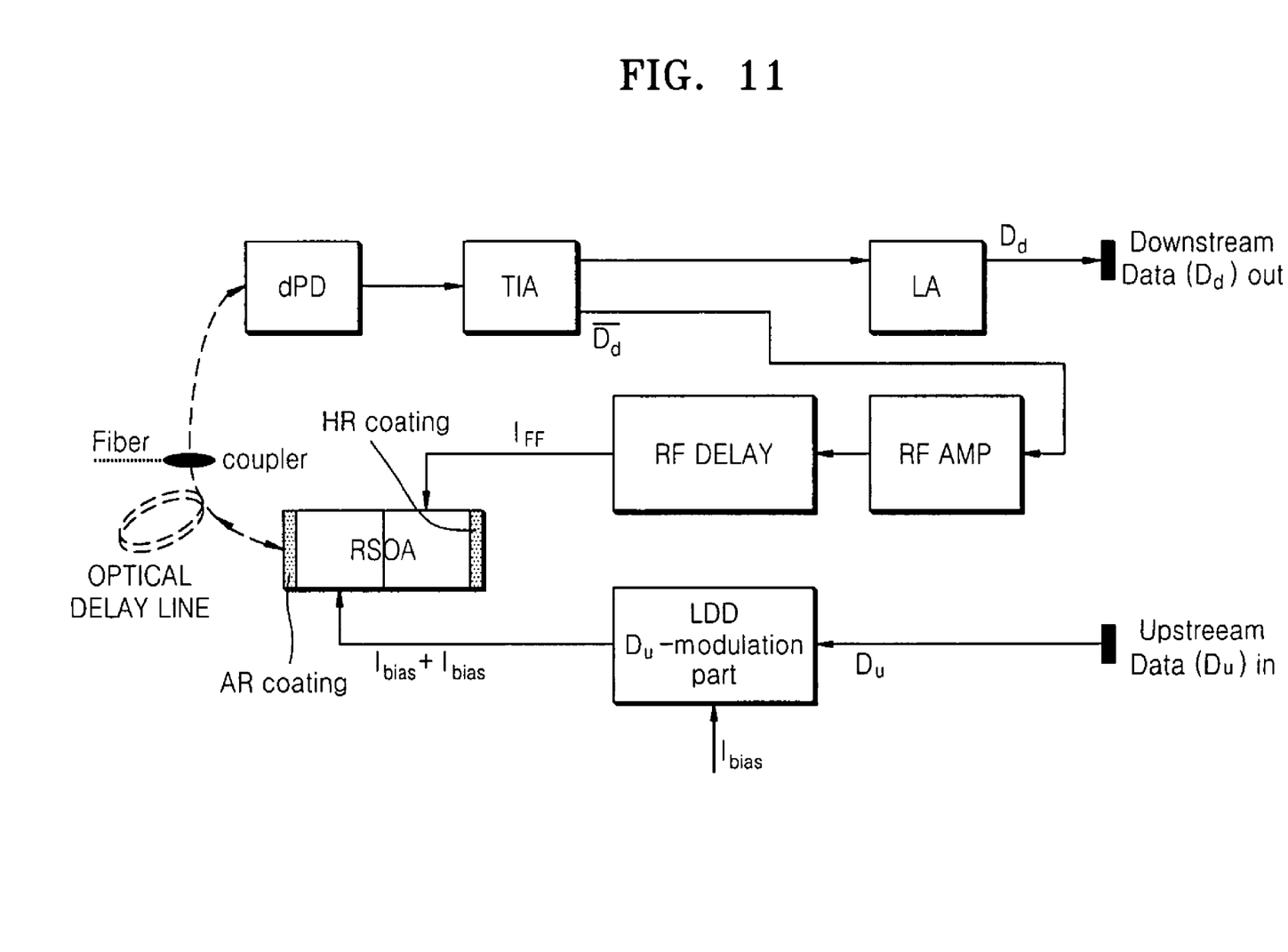
FIG. 11 illustrates an operating circuit for injecting feed-forward current into an RSOA, which includes two active regions, according to another embodiment of the present invention.

FIG. 11 illustrates an operating circuit for injecting feed-forward current into an RSOA, which includes two active regions, according to another embodiment of the present invention. The operating circuit illustrated in FIG. 11 has the same structure as that of the operating circuit illustrated in FIG. 8.

Figure 12:
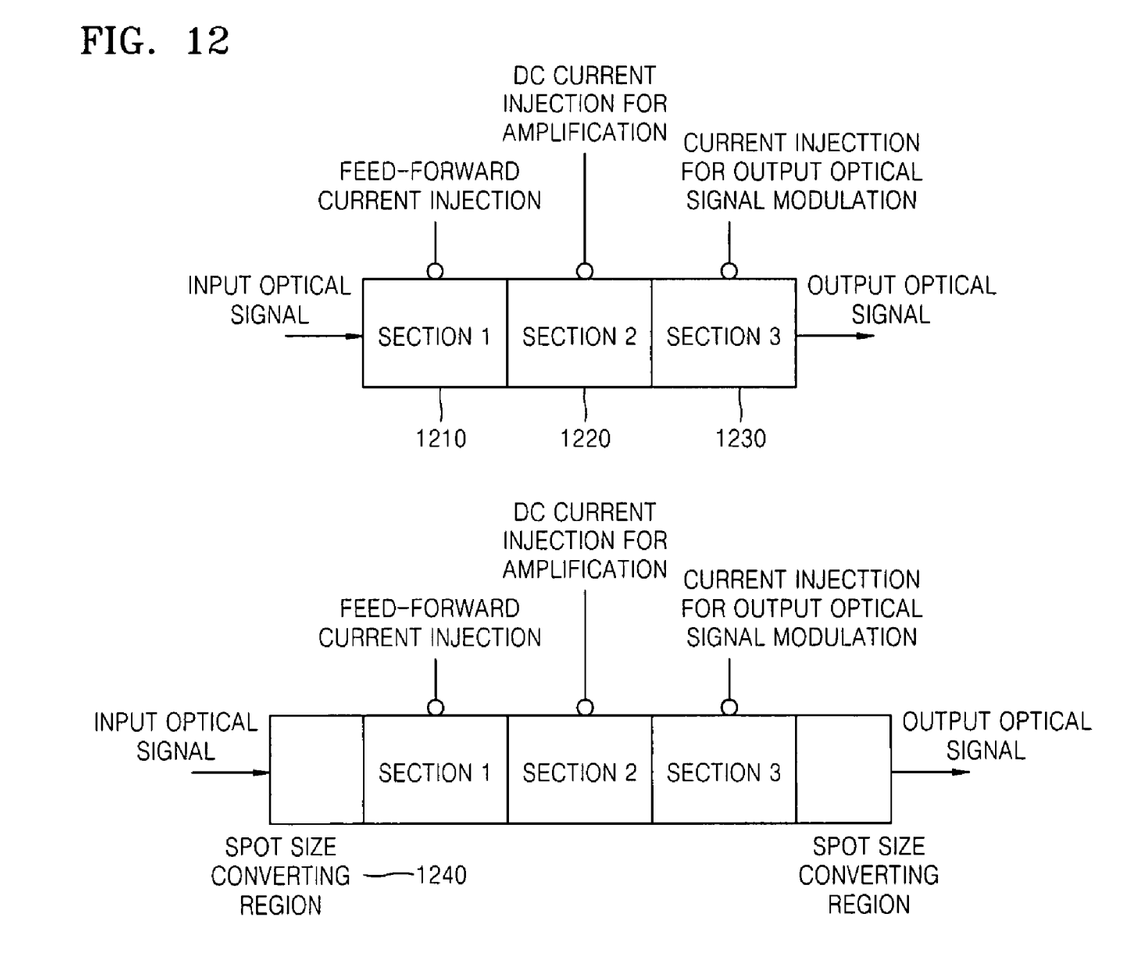
FIG. 12 illustrates the structure of a semiconductor optical amplifier (SOA), which includes three active regions to improve the flattening an input optical signal, according to an embodiment of the present invention.

FIG. 12 illustrates the structure of a semiconductor optical amplifier (SOA), which includes three active regions to improve the flattening an input optical signal, according to an embodiment of the present invention. Referring to FIG. 12, the SOA includes a front portion 1210, i.e., section1, a central portion 1220, i.e., section 2, a rear portion 1230, i.e., section3, and an SCC regions 1240, which are included when necessary.

The three active regions is comprised of the front portion 1210 to which a downstream optical signal is input, the central portion 1220 for optical amplification, and the rear portion 1230 which performs modulation to generate an output optical signal. The current for upstream optical signal modulation is injected to the rear portion 1230. The central portion 1220 receives DC current, and the current having polarity opposite to the modulation property of input optical signal is injected into the front portion 1210. The carrier density and the optical power gain of the front portion 1210 are changed according to the injected current so that the gain is reduced at the level '1' of an input optical signal and is increased at the level '0'. Accordingly, the ER of the input optical signal can be eventually reduced greatly.

The SCC regions 1240 can be used for increasing a coupling efficiency between optical fiber and the SOA, like a conventional SCC region.

In a WDM-PON that uses an RSOA in a gain saturation region in order to reuse a downstream optical signal using an amplitude squeezing effect, in actuality, the squeezing ability of the RSOA has a limit in a gain saturation state. For this reason, if the ER of a downstream optical signal is large, it is hard to squeeze the amplitude of the downstream optical signal sufficiently to avoid a trouble with upstream transmission. To solve this problem, the present invention actively controls current, which is injected into an RSOA, according to the magnitude of an input optical signal so that the ER of the input optical signal can be reduced more. According to this, the thickness of the level '1' of an upstream optical signal can be reduced more, so the power penalty of upstream optical signal transmission can be reduced and transmission quality can be improved. And also, the ER of downstream optical signal can be maintained higher than a value that is used normally, and therefore, downstream power penalty can be reduced, compared to the conventional methods that cannot avoid maintaining a low ER of a downstream optical signal. Especially, the problem that an ER of an downstream optical signal at a receiving point becomes lower than that at a transmitting point and transmission quality becomes worse rapidly even if the optical wavelengths of apparatuses that are comprised in a downstream link are slightly misaligned can be prevented.

As a result, the ER of a downstream optical signal can be increased sufficiently, so the quality and the reliability of downstream optical signal transmission can be improved. In addition, a modulated downstream optical signal is flattened sufficiently in the RSOA, so that the quality and the reliability of upstream optical signal transmission can also be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A reflective semiconductor optical amplifier that has a single active region, the reflective semiconductor optical amplifier comprising:
   a reflecting plane that reflects an input optical signal; and
   an optical amplifying semiconductor positioned at a side of the reflecting plane configured to receive a combination of a first signal with polarity opposite to that of the input optical signal and a second signal, having a modulated signal combined with a bias signal which is used to modulate the input optical signal reflected by the reflecting plane to an output optical signal.

2. A reflective semiconductor optical amplifier that has two active regions, the reflective semiconductor optical amplifier comprising;
   a reflecting plane that reflects an input optical signal; and
   an optical amplifying semiconductor comprising a rear portion, which is positioned at a side of the reflecting plane and to which a first signal having polarity opposite to that of the Input optical signal is injected, and a front portion, which is positioned at a side opposite to the side of the rear portion facing the reflecting plane and which the input optical signal is passed though and a second signal having a modulated signal combined with a bias signal is used to modulate a reflected input optical signal from the reflecting plane to an output optical signal is injected into.

3. A semiconductor optical amplifier that has three active regions, the semiconductor optical amplifier comprising:
   a first active region receiving a signal having polarity opposite to that of an input optical signal and flattening an amplitude of the input optical signal;
   a second active region positioned at a side of the first active region to receive DC current and amplify the input optical signal, which has passed through the first active region; and
   a third active region positioned at a side opposite to the side of the second active region, facing the first active region to receive a modulated signal, which is used to modulate the input optical signal that has passed through the second active region to an output optical signal.

4. The semiconductor optical amplifier of claim 3, further comprising a spot size converting (SSC) region which is added onto another side of each of the first active region and third active region.

5. A system for operating a reflective semiconductor optical amplifier, the system comprising:
   a splitter that splits an input optical signal to a first signal and a second signal;
   a reflective semiconductor optical amplifier having a single active region, which reflects the second signal with a reflecting plane and receives a combination between a signal with polarity opposite to the second signal and a signal used to modulate the second signal reflected from the reflecting plane to an output optical signal;

a data photo diode that converts the first signal into a current signal;

a transimpedance amplifier that amplifies and converts the current signal transmitted from the data photo diode Into a voltage signal;

a limiting amplifier re-amplifying the voltage signal transmitted from the transimpedance amplifier;

a first RF delay adjusting the phase of a feed forward signal output from the limiting amplifier and the phase of the downstream optical signal input to the RSOA sp that optical signal input to the RSOA is optimally flattened;

an AND gate allowing the output signal from the first RF delay to pass only when an upstream signal is at level '1' and blocking the output signal from the first RF delay when the upstream signal is at '0';

a second RF delay optimally adjusting the phases of the upstream signals splitted before the AND gate;

a optical delay line 611 optically supplementing electric delay through the first RF delay;

a first LD driver converting the output from the AND date into a current signal; and a second LD driver converting the output from the second RF delay into a current signal.

6. The system of claim 5, further comprising:

an RF amplifier amplifying the voltage signal that is transmitted from the transimpedance amplifier and has polarity opposite to the first signal to generate a flattening signal having an optimal level for flattening the optical amplitude of the second signal;

an RF delay adjusting output time so that the second signal optimally flattened by the flattening signal transmitted from the RF amplifier; and a signal combiner combining the flattening signal transmitted from the RF delay and the signal used to modulate the second signal to the output optical signal and injecting a combined signal to a single active region of the reflective semiconductor optical amplifier.

7. The system of claim 6, further comprising a limiting amplifier that re-amplifies the voltage signal transmitted from the transimpedance amplifier and transmits an amplified voltage signal to the RF amplifier.

8. The system of claim 5, wherein the reflective semiconductor optical amplifier is an optical amplifier having two active regions and comprises the reflecting plane that reflects an input optical signal; and an optical amplifying semiconductor comprising a rear portion, which is positioned at a side of the reflecting plane and to which a signal having polarity opposite to that of the input optical signal is injected, and a front portion, which is positioned at a side opposite to the side of the rear portion facing the reflecting plane and which the input optical signal is passed though and the signal used to modulate a reflected input optical signal from the reflecting plane to the output optical signal is injected into, wherein the flattening signal transmitted from the RF delay is injected into the rear portion of the reflecting semiconductor optical amplifier, which has two active regions, and wherein the signal used to modulate the second signal to the output optical signal is injected into the front portion of the reflective semiconductor optical amplifier, which has two active regions.

9. The reflective semiconductor optical amplifier of claim 1. wherein the modulated signal of the second signal comprises a portion of the input upstream data signal converted into a current signal.

10. The reflective semiconductor optical amplifier of claim 2. wherein the modulated signal of the second signal comprises a portion of the input upstream data signal converted into a current signal.

11. The semiconductor optical amplifier of claim 3. wherein the modulated signal comprises a portion of the input upstream data signal converted into a current signal.

* * * * *